United States Patent [19]

Inoue et al.

[11] Patent Number: 5,141,880
[45] Date of Patent: Aug. 25, 1992

[54] MANUFACTURING METHOD OF A JUNCTION GATE FIELD EFFECT TRANSISTOR

[75] Inventors: Yasuo Inoue; Hiroaki Morimoto, both of Hyogo, Japan

[73] Assignee: Mitsubishi Denki Kabushiki Kaisha, Tokyo, Japan

[21] Appl. No.: 669,080

[22] Filed: Mar. 12, 1991

[30] Foreign Application Priority Data

Mar. 13, 1990 [JP] Japan .................................. 2-63034

[51] Int. Cl.⁵ .......................................... H01L 21/265
[52] U.S. Cl. ........................................ 437/29; 437/21; 437/24; 437/40; 437/83; 437/84; 437/142; 437/911
[58] Field of Search .................. 437/21, 24, 29, 40, 437/41, 83, 84, 142, 228, 911; 357/22, 23.7

[56] References Cited

U.S. PATENT DOCUMENTS

| | | | |
|---|---|---|---|
| 3,681,668 | 8/1972 | Kobayashi | 357/22 |
| 3,975,752 | 8/1976 | Nicolay | 357/22 |
| 4,551,909 | 11/1985 | Cogan et al. | 357/22 |
| 4,609,414 | 9/1986 | Bouard | 437/142 |
| 4,772,927 | 2/1988 | Saito et al. | 437/21 |

OTHER PUBLICATIONS

Nishimura et al., "SOI Technology", *Applied Physics*, vol. 54, No. 12, 1985, pp. 274–1283.
Morimoto, "Focused Ion Beam Technique" for the 30th Semiconductor Seminar, Aug. 1989, pp. 233–253.
Melngailis et al., "Planar Vias through Si₃N₄ Fabricated by Focused Ion Beam Implantation", *J. Vac. Sci. Technol. B*, vol. 6, No. 3, May/Jun. 1989, pp. 1022–1025.
Grove, *Physics and Technology of Semiconductor Devices*, John Wiley & Sons, Inc., 1967, pp. 242–257.

*Primary Examiner*—Tom Thomas
*Attorney, Agent, or Firm*—Lowe, Price, LeBlanc & Becker

[57] ABSTRACT

In a manufacturing method of a junction gate field effect transistor, impurities of a first conductivity type are first implanted at a predetermined concentration into a monocrystal silicon layer separately formed on a region to be used as an active region in an insulating layer, and then surfaces of the monocrystal silicon layer and an insulating substrate are covered with a silicon oxide film. Then, impurities of a second conductivity type are implanted at a predetermined concentration into a portion to be used as a gate electrode in a monocrystal silicon layer by a focused ion beam method, and metal ions are implanted at a predetermined concentration into a portion to be used as a gate electrode of the silicon oxide film covering the monocrystal silicon layer by the focused ion beam method. Then, a polycrystal silicon gate electrode doped with impurities and having an area larger than the portion to be used as the gate electrode of the silicon oxide film is formed to cover a surface of the portion to be used as the gate electrode. Thereafter, impurities of the second conductivity type are implanted at a predetermined concentration into the monocrystal silicon layer, using this polycrystal silicon gate electrode as a mask, to form a source region and a drain region.

18 Claims, 13 Drawing Sheets

FIG. 1A    PRIOR ART

( $V_D \ll V_{DSAT}$ )

FIG. 1B    PRIOR ART ( $V_D = V_{DSAT}$ )

FIG. 1C   PRIOR ART ( VD > VDSAT )

MANUFACTURING METHOD OF A JUNCTION GATE FIELD EFFECT TRANSISTOR

BACKGROUND OF THE INVENTION

1. Field of the Invention

The present invention relates to a manufacturing method of a junction gate field effect transistor formed on an insulating substrate, and more particularly to a manufacturing method in which fine working or processing utilizing a focused ion beam technique is effected to form a junction gate field effect transistor of high performance in a simple process(es).

2. Description of the Background Art

As a background of the invention, an operation of a conventional junction gate field effect transistor (will be also call as "JFET" herein) will be described below with reference to FIGS. 1A–1C.

Figure 1A:
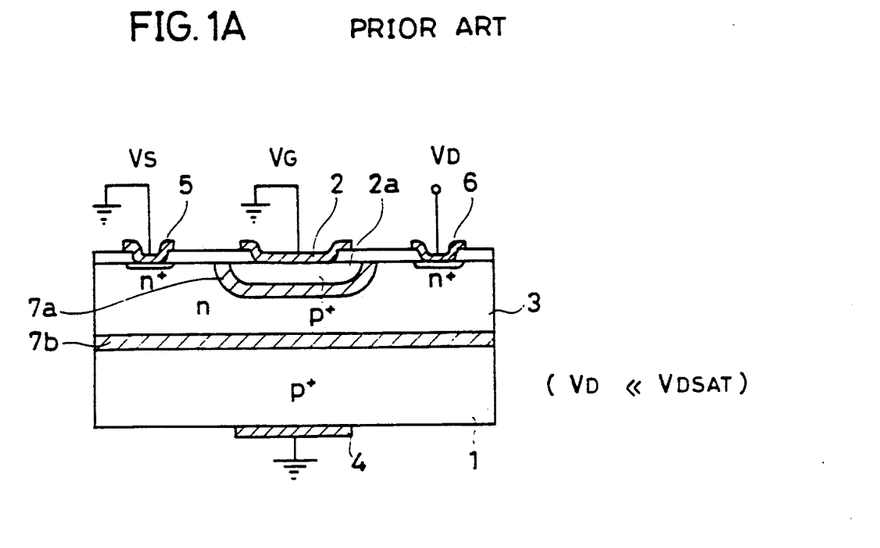
FIGS. 1A, 1B and 1C are sectional views illustrating a principle of an operation of a junction gate field effect transistor as a background of the invention.
Figure 1B:
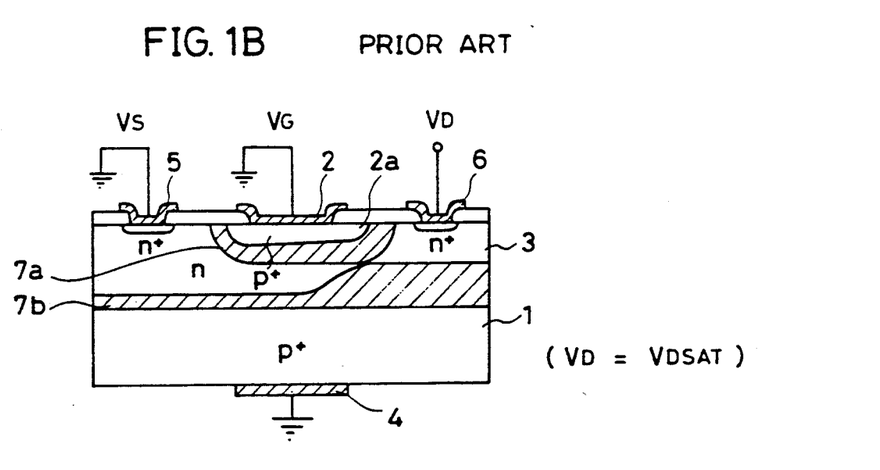
Figure 1C:
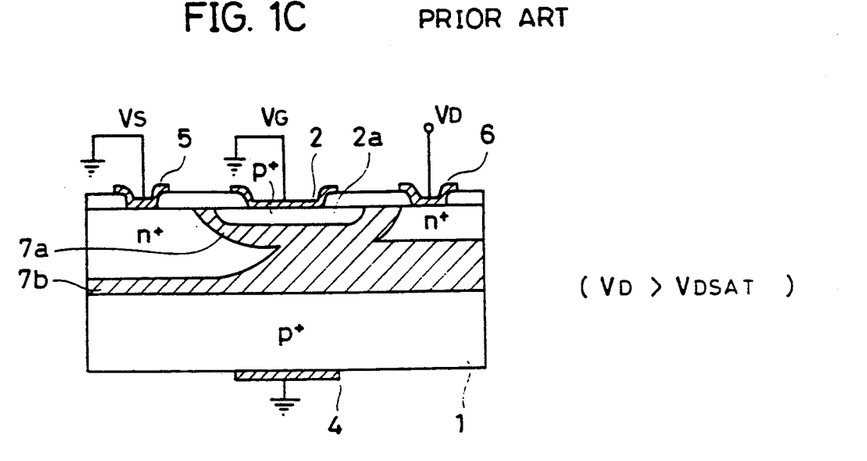

A JFET shown in FIGS. 1A–1C is formed on a so-called bulk silicon substrate, and the operation thereof can be described as follows (e.g., according to "Physics and Technology of Semiconductor Devices" A. S. Grove, p 244). In the conventional JFET shown in FIG. 1A, a substrate 1 and a region 2a below a gate electrode 2 are p-type regions having a high concentration, and a channel region 3 is a n-type region having a low concentration. As shown in FIG. 1A, when the gate electrode 2, a substrate electrode 4 and a source electrode 5 are grounded and a voltage $V_D$ at a drain electrode 6 is of a low value near 0 (zero), narrow depletion layers 7a and 7b are spread between the region 2a and the channel region 3 and between the p-type region of the substrate 1 and the channel region 3, respectively. In this condition, a path for a drain current $I_D$ flowing between the source electrode 5 and the drain electrode 6 is formed at a center of the channel region 3 located below the gate electrode 2. When the drain voltage $V_D$ is increased from this condition, the depletion layers 7a and 7b spread at the proximity of the drain electrode 6, narrowing a width of the channel region 3 in this area, which increases a resistance between the source electrode 5 and the drain electrode 6. When the drain voltage $V_D$ increases to a predetermined value $V_{DSAT}$, the depletion layers 7a and 7b connect to each other, and thus the channel region is divided (FIG. 1B). When the drain voltage $V_D$ increases over $V_{DSAT}$, overlapping portions of the depletion layers 7a and 7b further increases (FIG. 1C), but the drain current $I_D$ increases no longer and tends to exhibit a saturation state.

Figure 1D:
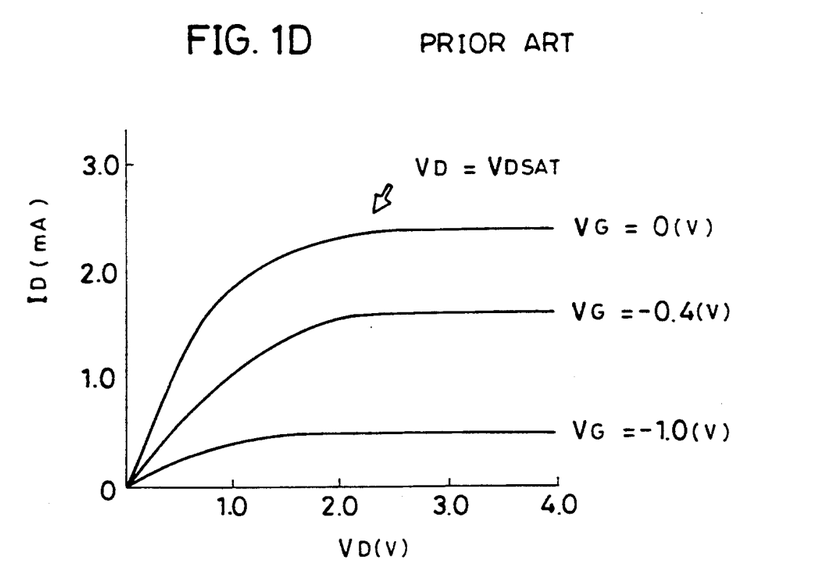
FIG. 1D is a graph illustrating a relationship between a drain voltage $V_D$ and a drain current $I_D$ of a junction gate field effect transistor.

If a negative voltage is applied to the gate electrode 2 and the substrate electrode 4, the depletion layers 7a and 7b spread to a larger extent with the same $V_D$. Utilizing this, potentials in the gate electrode 2 and the substrate electrode 4 may be changed to control the drain current $I_D$. The drain voltage $V_D$ and the drain current $I_D$ have a relationship as shown by a graph in FIG. 1D.

Figure 2A:
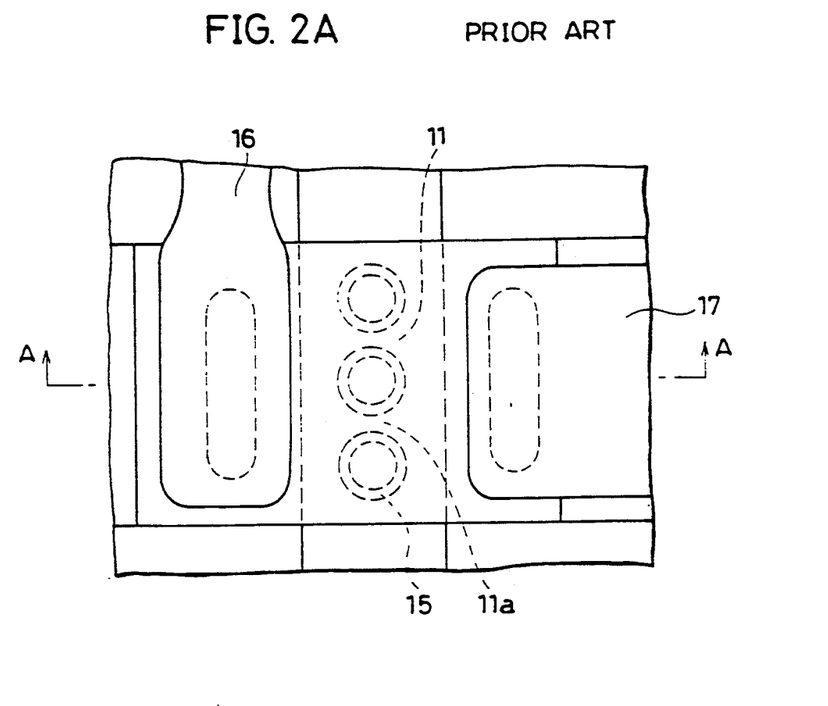
FIG. 2A is a plan view of a SOI type JEFT manufactured in a conventional method.
Figure 2B:
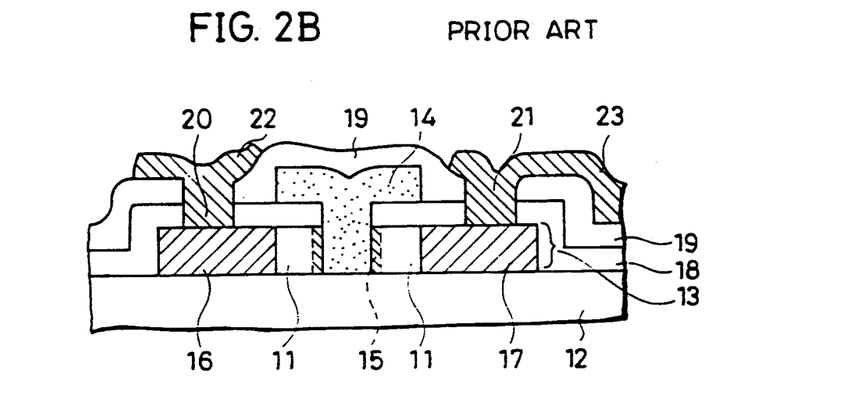
FIG. 2B is a sectional view taken along line A—A in FIG. 2A.

Then, a structure and a manufacturing method of a conventional JFET which is formed on a SOI (Silicon on Insulator) including an insulating substrate and a monocrystal silicon layer grown thereon. The conventional SOI type JFET shown in FIG. 2A and 2B has a channel region 11 electrically floated by an insulating substrate 12. As shown in FIG. 2B, a gate electrode 14 made from doped polysilicon is buried in a center of the channel region 11, so that a current in the channel region 11 may be controlled by the gate electrode 14 even if a monocrystal silicon layer 11 formed on the insulating substrate 12 has a large thickness. On applying a predetermined voltage to the gate electrode 14, a depletion layer 15 spreads as shown in FIG. 2A and 2B, and thus narrows a path 11a for the current in the channel region 11, so that the resistance in this region increases. In this manner, a drain current flowing between a source region 16 and a drain region 17 can be controlled. The monocrystal silicon layer 13 is covered with a silicon oxide film 18, and a surface of the gate electrode 14 is covered with a silicon oxide film 19. On the silicon oxide film 19, there are provided wiring layers 22 and 23 of, e.g., aluminum, connected to the source region 16 and the drain region 17 through contact holes 20 and 21, respectively. As the SOI techniques for forming the monocrystal silicon layer 13 on the insulating substrate 12, there are following techniques: a gas phase growth method in which epitaxial growth of silicon is effected on crystalline insulating material having a lattice constant nearly equal to that of the silicon; a solid phase growth method in which a silicon substrate is covered with $SiO_2$ except for a portion forming an opening, an amorphous silicon film is then deposited thereon and an annealing is effected for a long time at an temperature of about 600° C. to perform a solid phase epitaxial growth; a melting crystallization method in which polycrystal silicon layer deposited on an insulating layer is partially heated e.g., by a laser beam to form a molten region and recrystallization is effected while moving the molten region on a wafer; and an insulating film burying method in which oxygen or nitrogen ions are implanted at about $10^{18}$ dose into a monocrystal silicon, leaving the monocrystal silicon on the surface and forming a $SiO_2$ layer or a $S_3N_4$ layer at the interior (For example, "Applied Physics", Vol. 54, NO. 12, 1985, pp. 1274–1283). As a typical SOI substrate formed by the gas phase growth method, there is a SOS (Silicon-on-sapphire) including a sapphire substrate and a monocrystal silicon film grown thereon. Among the SOI techniques utilizing the insulating film burying method, a technique utilizing implantation of oxygen ions is called as SIMOX (Separation by Implanted Oxygen). A laminated substrate, in which a substrate and a monocrystal silicon layer are stuck together with an insulating film therebetween.

The conventional manufacturing method of the SOI type JFET described above will be further described below with reference to FIG. 3A–3J.

Figure 3A:
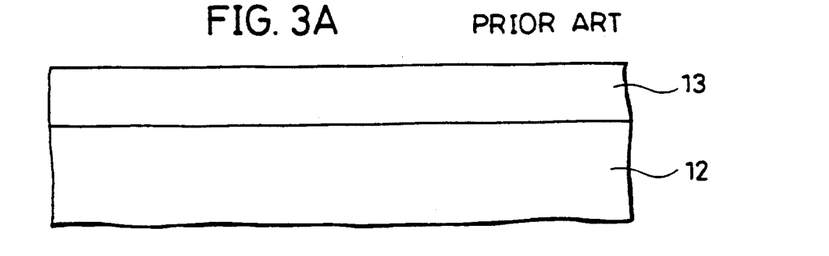
FIGS. 3A, 3B, 3C, 3E, 3F, 3G, 3H, 3I and 3J are sectional views illustrating respective steps in a conventional method of a SOI type JFET.
Figure 3B:
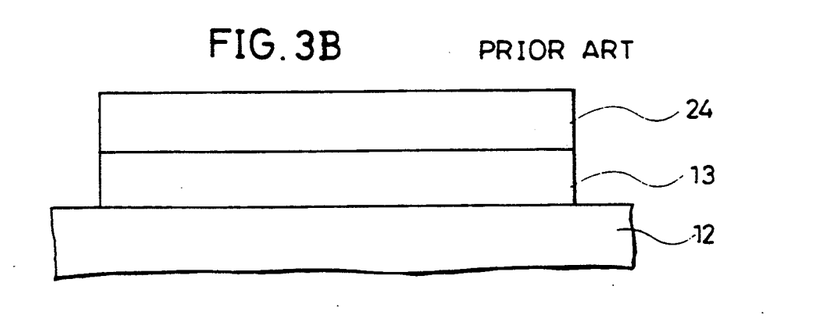

FIG. 3A illustrates a sectional structure of a SOI substrate at a start of the manufacturing of the SOI type JFET. The SOI substrate includes an insulating substrate 12 and a monocrystal silicon layer 13 grown thereon by any method described above. A resist film 24 is initially formed only on an region forming JFET in a surface of the monocrystal silicon layer 13 in the SOI substrate, and then patterning of the monocrystal silicon layer 13 is effected by etching to form structure shown in FIG. 3B. Before or after this patterning, implantation of impurity ions is effected for setting a resistance value in a region which will become a channel region in the JFET. In the following description, it is assumed that a conductivity type of the channel is a p-type and arsenic ions are implanted at about $1 \times 10^{12}$ dose into the whole active region.

Figure 3C:
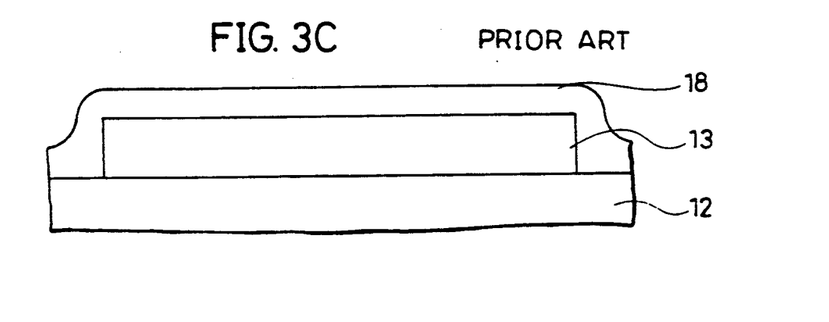

After separation of the active area by the patterning of the monocrystal silicon layer 13 described above and removal of the resist layer 24, a silicon oxide film 18 of about 2000 Å is deposited on the whole surface of the wafer by the CVD method (FIG. 3C).

Figure 3D:
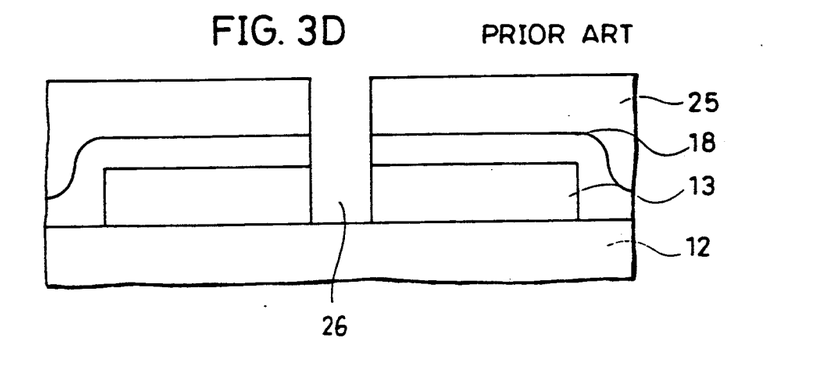
Figure 3E:
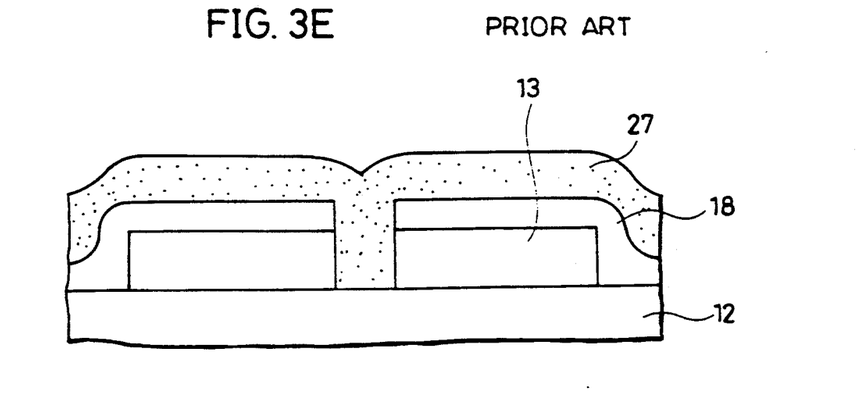

Then, a resist film 25 is formed on the silicon oxide film 18, and the monocrystal sillicon layer 13 and the silicon oxide film 18 are partially removed to form a portion 26 for burying a gate electrode, using a lithography technique and etching (FIG. 3D). Then, polysilicon 27 in which impurity ions are doped is deposited on the whole surface of the wafer for forming the gate electrode (FIG. 3E). Alternately, undoped polysilicon may be deposited, and PSG (Phosphosilicate Glass) may be formed on the surface thereof to diffuse phosphorus (P) contained in the PSG into the polysilicon.

Figure 3F:
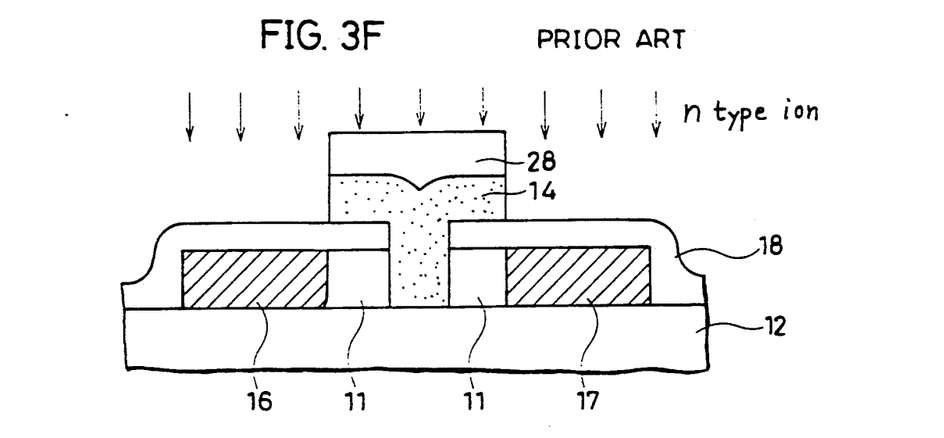
Figure 3G:
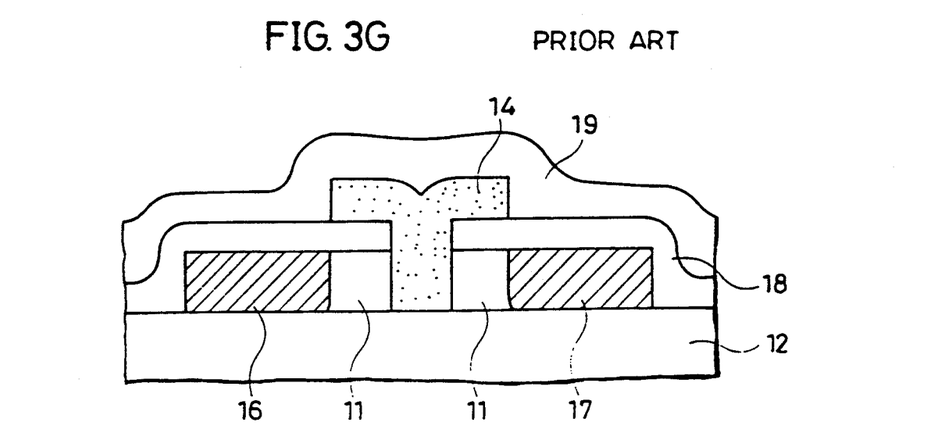

A resist film 28 is then formed, and patterning for the gate electrode 14 is effected by the lithography. Before removing the resist film 28, phosphorus or arsenic is implanted at $1 \times 10^{15}$ dose into the whole surface of the wafer to form a source region 16 and a drain region 17 by self-alignment (FIG. 3F).

Figure 3H:
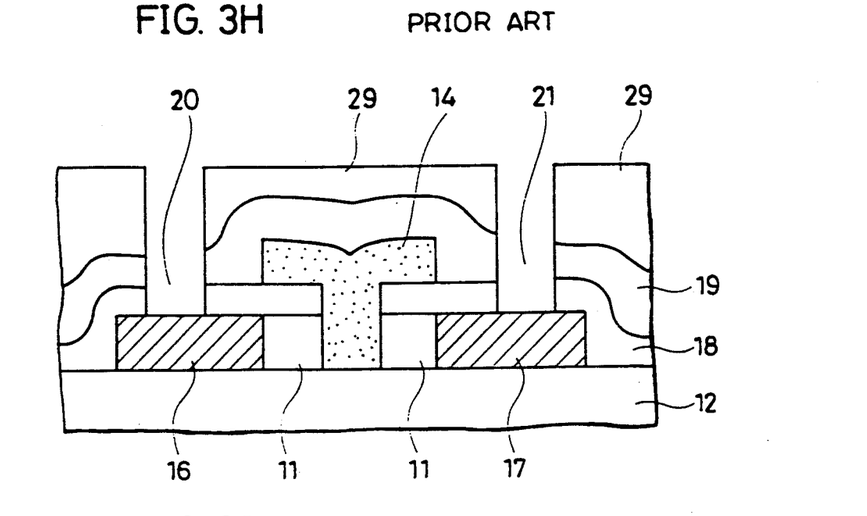

After removing the resist film 28, a silicon oxide film 19 of about 2000 Å in thickness is deposited as a layer insulating film (FIG. 3G), and after forming the resist film 29, the contact holes 20 and 21 are formed by the lithography and the etching (FIG. 3H).

Figure 3I:
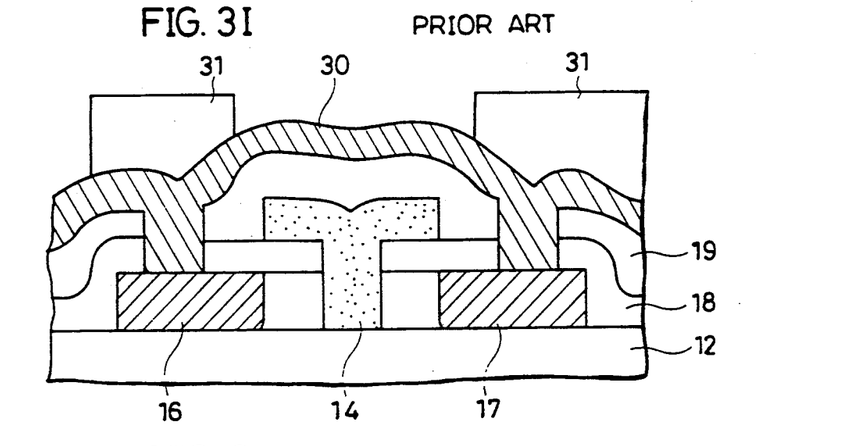
Figure 3J:
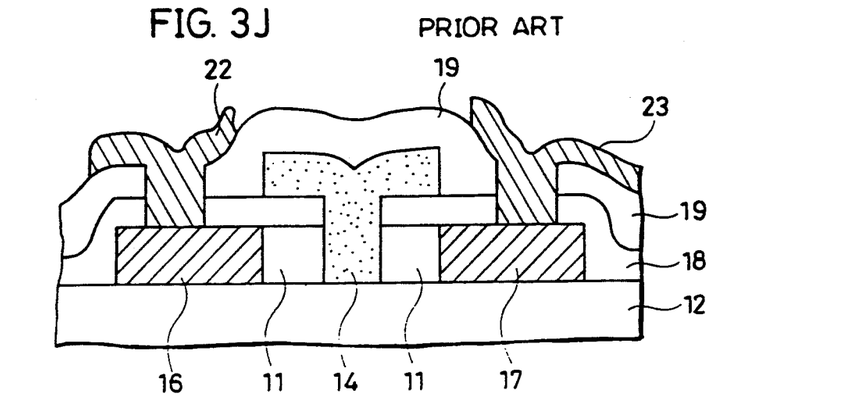

After removing the resist film 29, a metal layer 30 is deposited on the whole surface of the wafer, and a pattern of the resist film 31 is formed for patterning the metal layer 30 by the lithography (FIG. 3I). Then, the patterning is effected by the etching to form the wiring layers 22 and 23, whereby the wiring in the transistor is completed (FIG. 3J).

However, the conventional method described above, in which the JFET is formed on the SOI substrate, has following problems.

Figure 4:
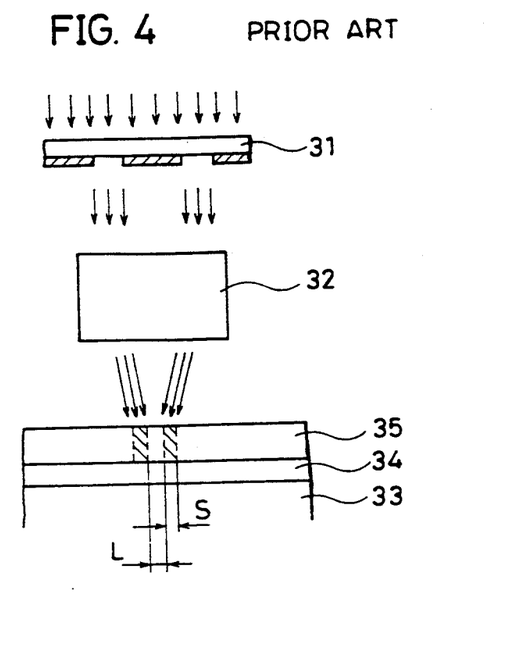
FIG. 4 is a schematic view illustrating exposure by a reduction optical system in a photolithography.

In the above conventional manufacturing steps, the lithography technique employing reduction projection with the light is utilized in the step for applying and patterning the resist film. In this photolithography technique, as shown in FIG. 4, the light in a predetermined pattern passed through the mask 31 is projected by a reduction optical system 32 on a resist film 35 applied on the polysilicon layer 34 and the silicon oxide film 33 for the exposure. In FIG. 4, minimum values of pattern sizes indicated by S and L are limited to a value of 0.4–0.5 μm which is similar to the wave length of the light.

Figure 5:
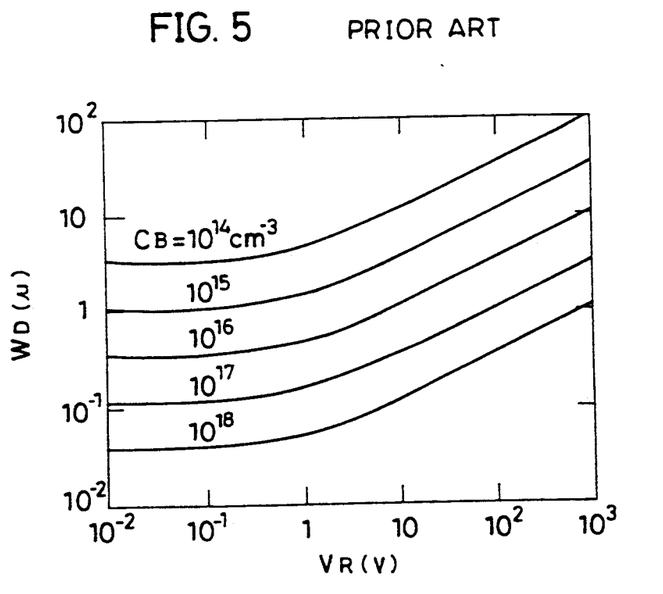
FIG. 5 is a graph illustrating a relationship between a width $W_D$ of a depletion layer and a reverse bias voltage $V_R$ in a junction gate field effect transistor with respect to channel impurity concentrations $C_B$ at five steps.

On the other hand, the width of the depletion layer formed between the gate and the channel is determined by the concentration of the impurities in the channel, and a width $W_D$ of the depletion layer and a reverse bias voltage $V_R$ applied across the gate electrode and the drain electrode have a relationship as indicated by a graph in FIG. 5 with respect to various impurity concentrations $C_B$. For example, at the impurity concentration $C_B$ of $1 \times 10^{15} cm^{-3}$, the width $W_D$ of the depletion layer is nearly more than 1 μm, and thus the channel part can be fully depleted even if the gate electrode is formed with a conventional minimum processing size. In this case, the electrical resistance is however increased at the channel part, and thus a high drain current can not be flowed. In order to reduce the electrical resistance at the channel part, it is necessary to increase the channel concentration. For example, at the channel concentration of $1 \times 10^{17} cm^{-3}$, the electrical resistance can be reduced by two orders. However, by applying the reverse bias voltage $V_R$ in such a case, the depletion layer spreading in the channel region have the width $W_D$ of the about 0.1 μm. Therefore, in the processing technique utilizing the conventional lithography technique, it is difficult to form the channel of sizes enough to fully deplete the channel region in this channel concentration.

The foregoing can be summarized in general as follows with respect to SOI type JFET.

Figure 6:
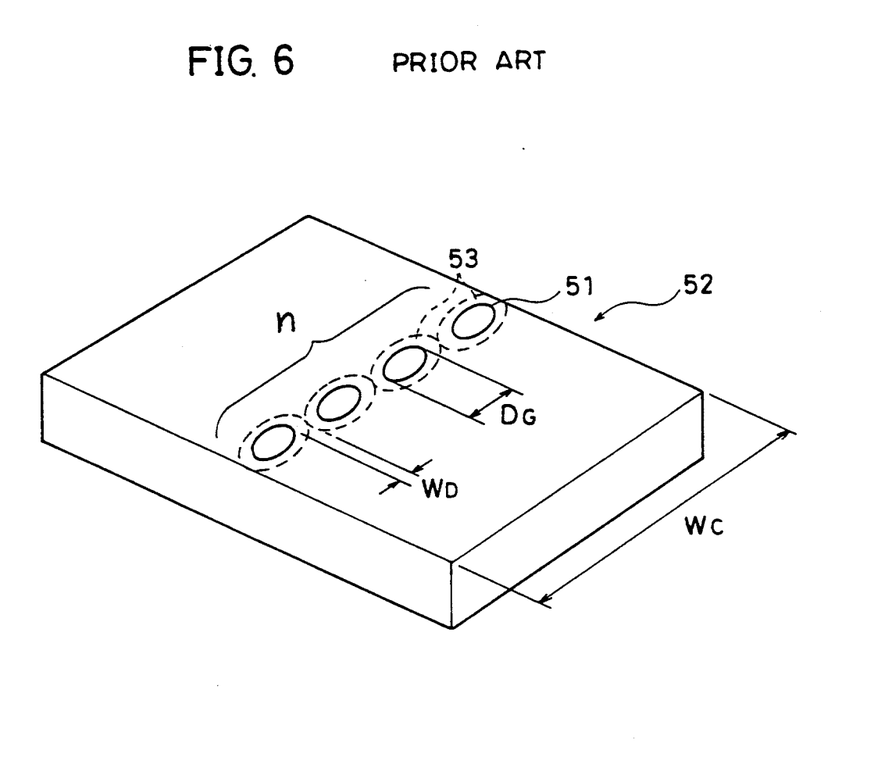
FIG. 6 is a perspective view illustrating a relationship between a channel, gate electrodes and widths of respective depletion layers.

Referring to FIG. 6, a SOI type JFET 52 including implanted gate electrodes 51, which are n in number, in the channel is required to satisfy a following conditional expression for effectively operating the gate electrode to control the drain current with a p-n junction;

$$n D_G + 2 n W_D > W_C$$

where $D_G$ is a diameter of the buried gate electrode, $W_D$ is a spread width of the depletion layer 53, and $W_C$ is a channel width.

SUMMARY OF THE INVENTION

An object of the invention is provide a manufacturing method of a JFET of a SOI type having a fine structure, the FET having an buried gate electrode and having a channel of a low resistance, and said gate electrode being adapted to effectively control drain current by complete depletion of a channel region which can be effected by application of a reverse bias voltage.

In a manufacturing method of a junction gate field effect transistor according to the invention, impurities of a first conductivity type are first implanted at a predetermined concentration into a monocrystal silicon layer formed on a region to be used as an active region on an insulating layer, and then surfaces of the monocrystal silicon layer and the insulating layer are covered with a silicon oxide film. Then, impurities of a second conductivity type are implanted at a predetermined concentration into a portion to be used as a gate electrode in a polycrystal silicon layer by a focused ion beam method, and metal ions are implanted at a predetermined concentration into a portion to be used as a gate electrode of a silicon oxide film covering the monocrystal silicon layer by the focused ion beam method. Then, a polycrystal silicon gate electrode doped with impurities and having an area larger than the portion to be used as the gate electrode of the silicon oxide film is formed to cover a surface of the portion to be used as the gate electrode. Thereafter, impurities of the second conductivity type are implanted at a predetermined concentration into the monocrystal silicon layer, using this polycrystal silicon gate electrode as a mask, to form a source region and a drain region.

According to the invention, since the formation of the gate electrode in the monocrystal silicon layer and the silicon oxide film is effected by the focused ion beam method, the gate electrode and the channel region can be formed to have a diameter at a buried portion and a width which are 0.1 μm, respectively. Therefore, even if a channel impurity concentration is increased to a value of $1 \times 10^{17}/cm^3$ for reducing an electrical resistance in the channel region, the channel region can be entirely depleted owing to a width of the depletion layer which can be controlled by the application of the reverse bias voltage, and thus the drain current can be controlled.

Since the formation of the gate electrode can be effected without requiring a special work for an aperture in the monocrystal silicon layer and the silicon oxide film, lithography and etching process for forming the aperture can be eliminated, and flatness of the device is also improved.

In the present invention, it is preferable to use phosphorus ions as the impurities of the second conductivity type to be implanted by the focused ion beam method into the portion of the monocrystal silicon layer for the gate electrode, i.e., the portion to be used as the gate electrode.

Metal selected from gallium, indium, lead, gold, or alloy of two or more kinds of them may be desirably used as an ion source for the metal ions to be implanted by the focused ion beam method into the portion for the gate electrode of the silicon oxide film covering the monocrystal layer.

The monocrystal silicon layer on the insulating layer which is used in the present invention may be formed by a gas phase growth method in which epitaxial growth of silicon is effected on crystalline insulating material having a lattice constant nearly equal to that of the silicon, or by a solid phase growth method in which a silicon substrate is covered by silicon oxide except for a portion forming an opening to expose the silicon substrate, an amorphous silicon film is then deposited thereon and an annealing is effected for a long time at an temperature of about 600° C. to perform a solid phase epitaxial growth.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 7A:
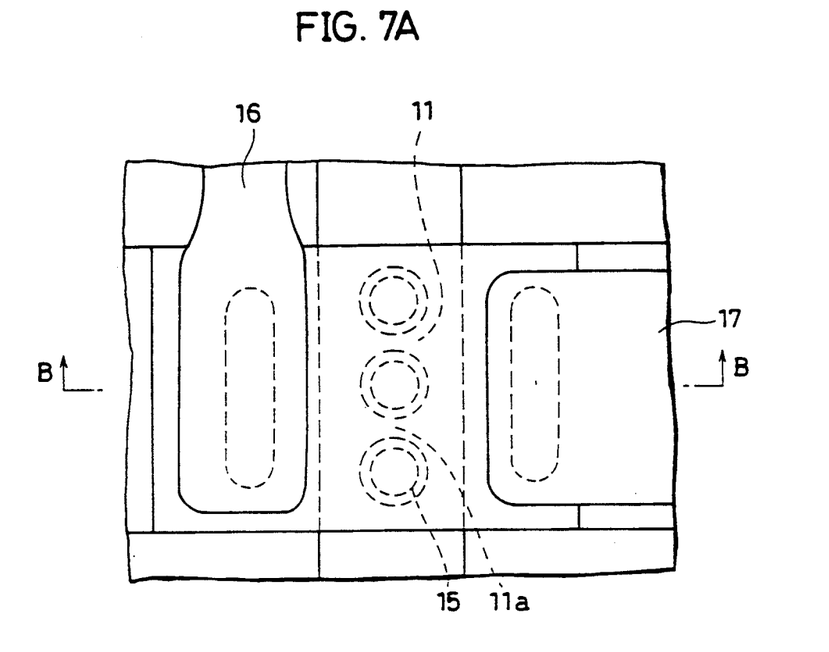
FIG. 7A is a plan view of a junction gate field effect transistor manufactured by a method of an embodiment of the invention.
Figure 7B:
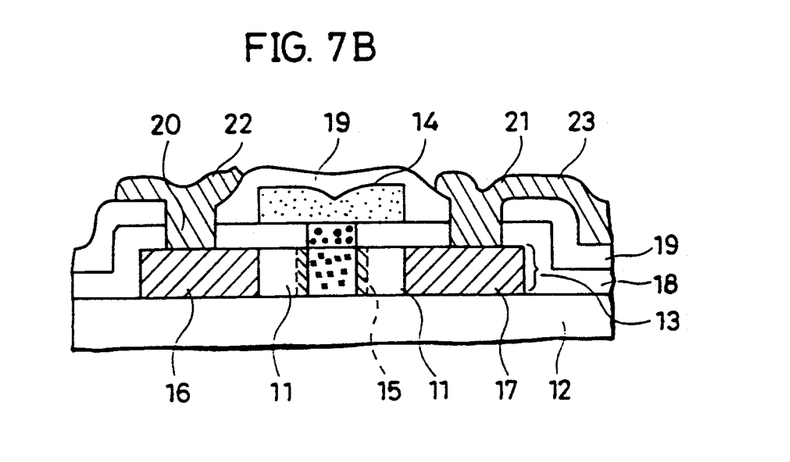
FIG. 7B is a sectional view taken along line B—B in FIG. 7A.

An embodiment of the invention will be described herein after with reference to the accompanying drawings. FIG. 7A is a plan view of a SOI type JFET manufactured by a manufacturing method according to the invention, and FIG. 7B is a sectional view taken along line B—B in FIG. 7A. A structure itself of the SOI type JFET manufactured in this embodiment is basically the same as that in the prior art shown in FIGS. 2A and 2B, except for features relating to a method for forming gate electrodes and for contacting wirings with the gate electrodes.

Manufacturing steps of this embodiment are as follows.

Figure 8A:
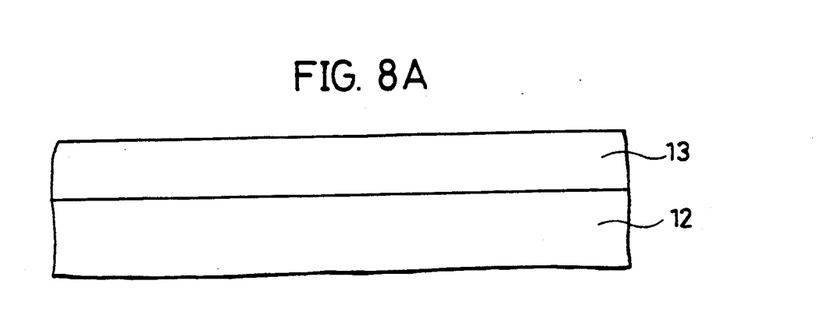
FIGS. 8A, 8B, 8C, 8D, 8E, 8F, 8G, 8H, 8I, 8J and 8K are sectional views illustrating respective manufacturing steps for a junction gate field effect transistor in an embodiment of the invention.
Figure 8B:
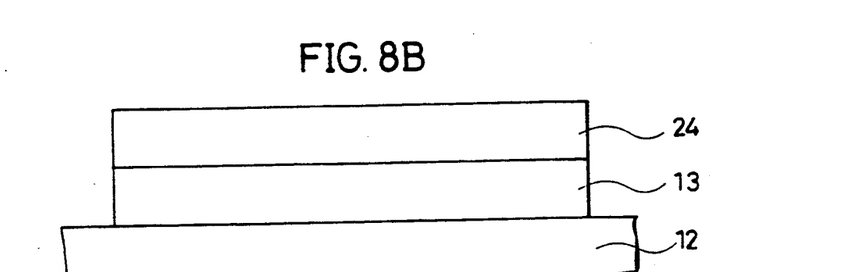

First, a resist film 24 is formed only on an active region, i.e., a region for forming the JFET on a SOI substrate which includes an insulating substrate 12 and a monocrystal silicon layer 13 formed thereon by a gas phase growth method or a solid phase growth method described above (FIG. 8A). Etching is effected for patterning the thus formed silicon layer 13 to separate the active region as shown in FIG. 8B. Before or after this patterning, impurity ion implantation is effected to set a resistance value in a region to be used as a channel region of the JFET. A conductivity type of the impurity ions implanted into this channel region may be of either p-type or n-type. In the following description of the embodiment, it is assumed that boron ions which is of the p-type are implanted at a concentration of $1 \times 10^{12}$ dose for forming the JFET having the p-type channel region.

Figure 8C:
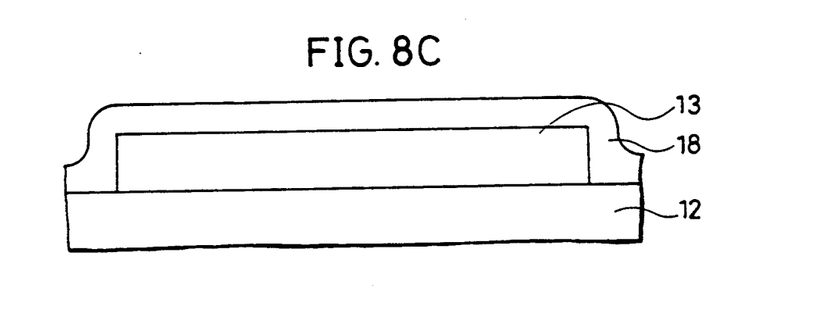

After effecting an element separation in the region for the JFET, a silicon oxide film 18 of about 2000 Å in thickness is deposited on a whole surface of a wafer by a CVD method (FIG. 8c).

Figure 8D:
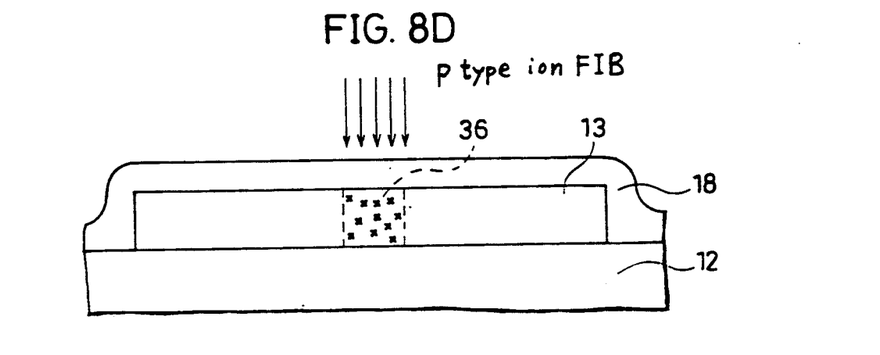
Figure 9A:
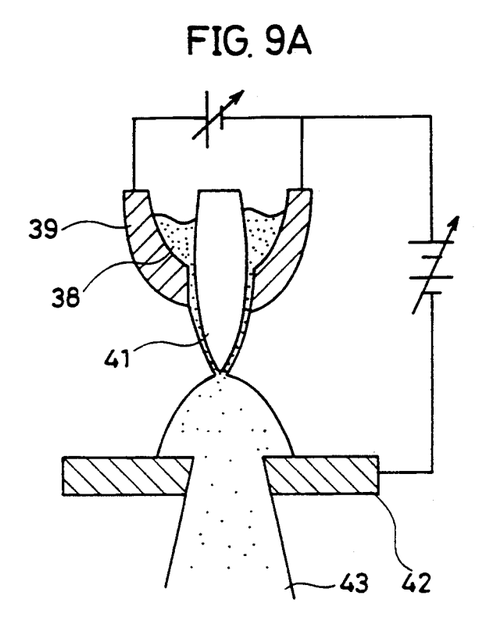
FIG. 9A is a sectional view illustrating a principle of an ion source in a focused ion beam device used in an embodiment.

The foregoing steps are the same as those in the conventional manufacturing method of the SOI type JFET described before. In the prior art, the gate electrode 14 is formed from a state in FIG. 2C by utilizing the lithography technique. However, in this embodiment, ions such as phosphorus ions of a conductivity type, i.e., n-type, opposite to that of the channel is irradiated and implanted as indicated by arrows in FIG. 8D, by a focused ion beam (will be called as "FIB" hereinafter) method into a portion to be used as a gate electrode in the monocrystal silicon layer 13. Preferably, an injection energy by this FIH is set in a range approximately from 50 KeV to 150 KeV, a dose is set in a range approximately from $10^{15}/cm^2$ to $10^{17}/cm^2$, and a concentration of the phosphorus ions is set in a range from $10^{19}/cm^3$ to $10^{21}/cm^3$. In the FIB technique, since the ions are charged particles, they can be controlled to have a high velocity and a high accuracy by an electric field or a magnetic field, and thus it is possible to obtain a parallel beam or focused beam having a good linearity in a solid and a high energy by electrical acceleration. It has already been shown by Monte Carlo simulation that the locus of the irradiated ion beam can be effectively utilized in superfine processes at a magnitude of about 0.1 μm ("Focused Ion Beam Technique", for the 30th semiconductor seminar, Hiroaki Morimoto, 1989 Aug., pp 233–253). A principle of an ion source in a device used in this FIB is schematically shown in FIG. 9A (see the above reference p 234). This ion source is composed of, as shown in FIG. 9A, a reservoir 39 for ionization material 38, a heater (not shown) for melting the ionization material, and a needle 41 emitting an ion beam from a tip end thereof having a radius of curvature of about 1 μm. The melted ionization material flows through a surface of the needle 41, producing a high field between the tip end of the needle 41 and a pullout electrode 42, so that the ion beam is emitted by field ionization.

Figure 9B:
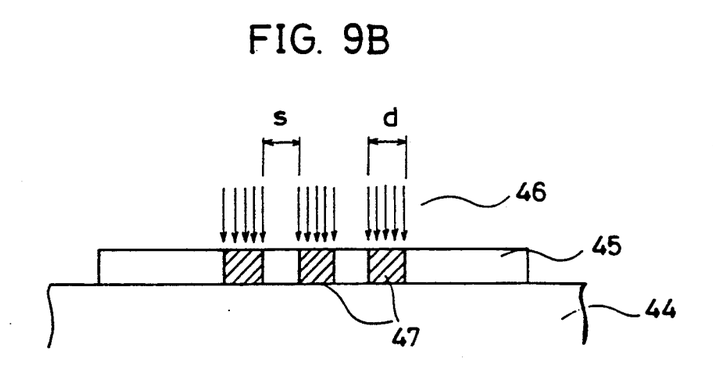
FIG. 9B is a sectional view illustrating formation of an impurity implantation region in a monocrystal silicon layer on an insulating substrate with impurity ions irradiated by a focused ion beam device.

Impurities such as phosphorus or arsenic are used as the ion source of the ion beam thus emitted. As shown in FIG. 9B, an ion beam 46 is irradiated to a monocrystal silicon layer 45 formed on an insulating substrate 44 to form a high concentration impurity region 47. In this case, illustrated size s and d may be of extremely small values of about 0.1 μm at most.

Figure 8E:
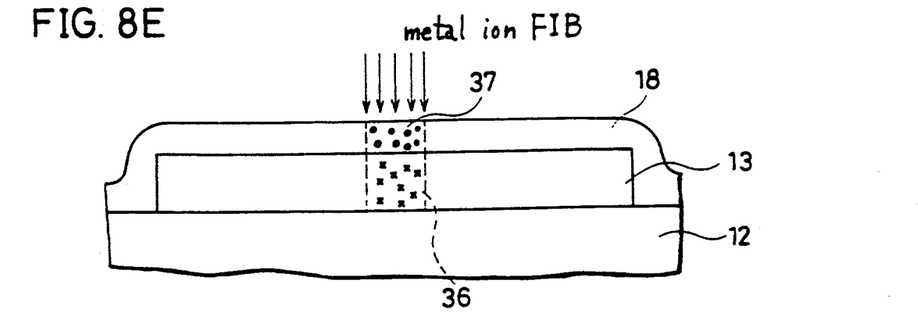

In the manufacturing steps of the embodiment, after the concentration of the phosphorus ion in a portion for the gate electrode in the monocrystal silicon layer 3, i.e., in the phosphorus ion implantation region 36, reaches a predetermined value, the ion source in the FIB device is changed to metal. Thereby, a metal ion beam is irradiated and thus a metal ion implantation region 37 containing the metal ions in a high concentration is formed at a portion for the gate electrode in the silicon oxide film 18 (FIG. 8E). As the ion source for these metal ions may be selected from gallium (GA), indium (In), tin (SN), gold (Au) or alloy thereof (see said reference p 235). In this case, an implantation energy by this FIB is set in a range approximately from 100 KeV to 1000 KeV, a dose is set in a range approximately from $10^{16}/cm^2$ to $10^{19}/cm^2$, and a concentration of the ions is set in a range from $10^{20}/cm^3$ to $10^{23}/cm^3$.

Figure 8F:
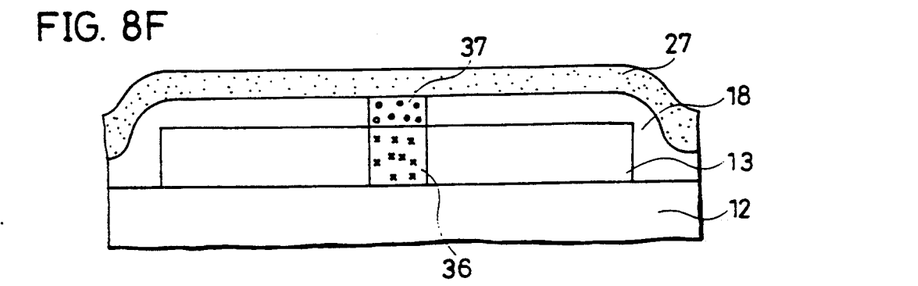
Figure 8G:
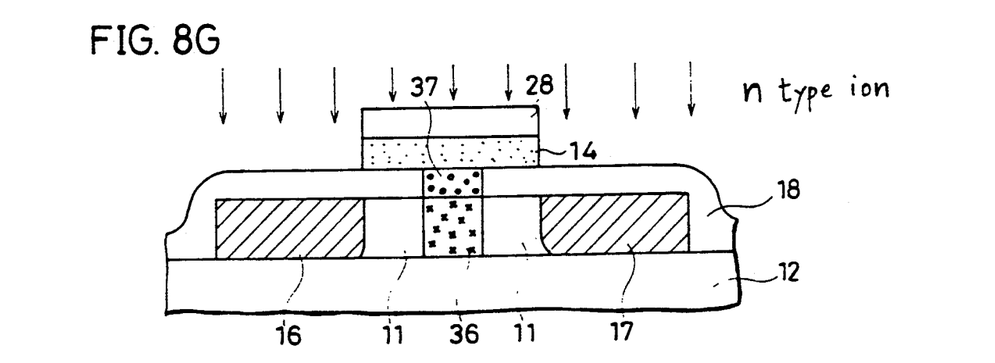
Figure 8H:
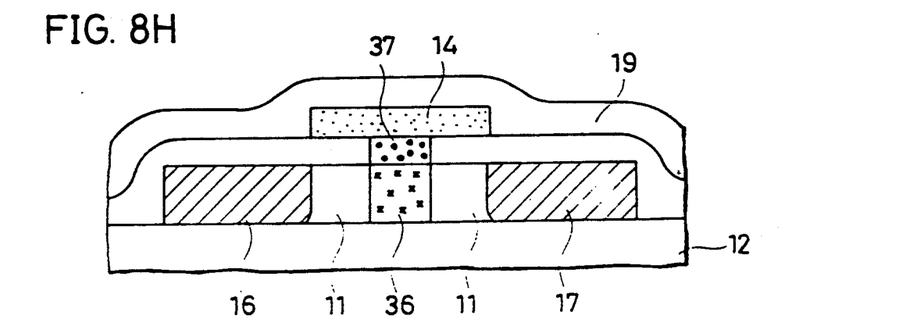
Figure 8I:
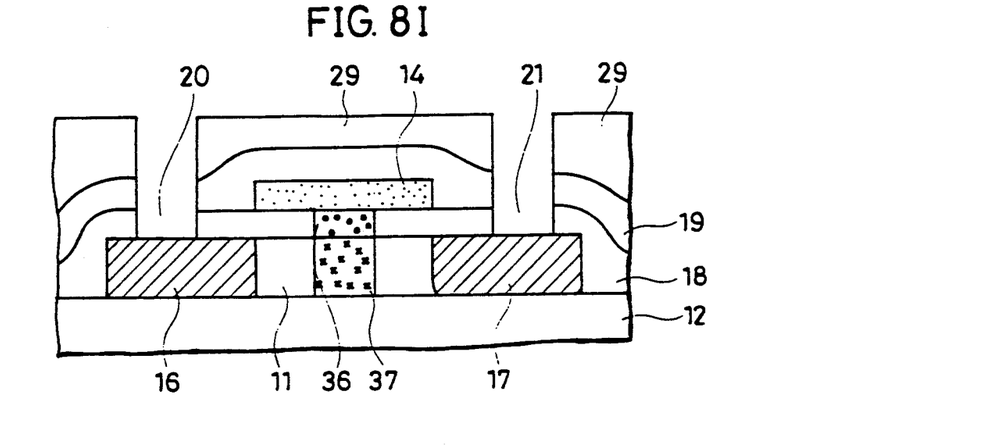
Figure 8J:
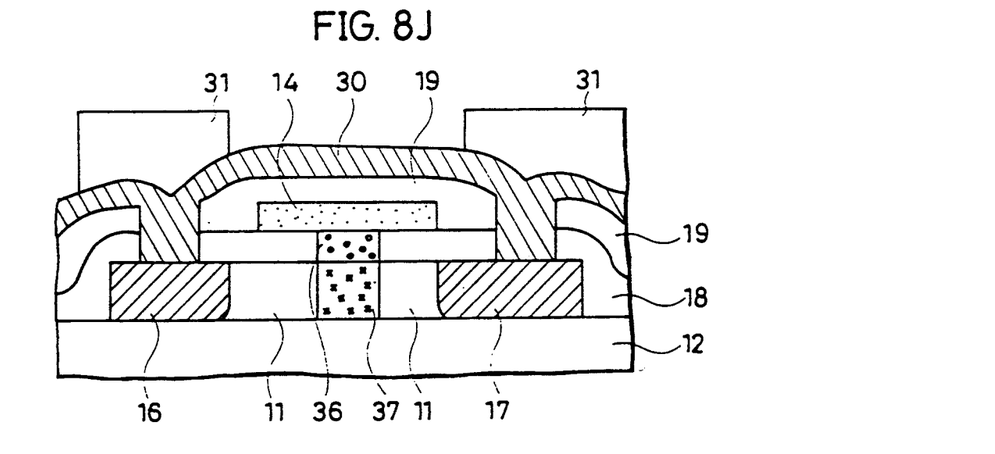
Figure 8K:
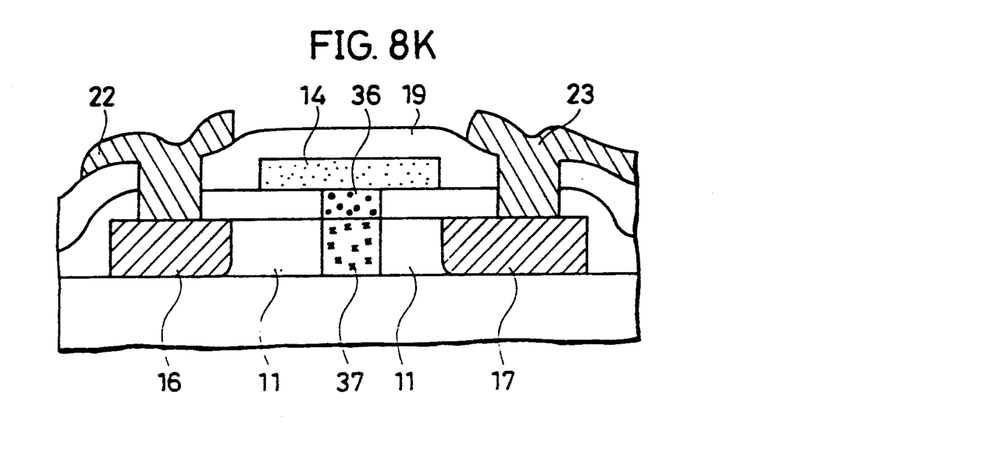

Then, polysilicon 27 doped with impurities such as phosphorus is deposited on the whole surface of the wafer (FIG. 8F), a resist film 28 is formed for contacting with the portion 37 for the gate electrode, and the patterning is effected by the lithography. After this patterning, phosphorus or arsenic ions, which are impurities of the conductivity type (i.e., n-type) opposite to that of the channel, are implanted at a dose of $10^{15}/cm^2 10^{17}/cm^2$, leaving the resist film 28, and thereby the source region 16 and the drain region 17 are formed (FIG. 8G). After removing the resist film 28, the silicon oxide film 19 of about 2000 Å in thickness is deposited on the whole surface of the wafer (FIG. 8H). Subsequently, a resist film 29 is formed and the contact holes 20 and 21 are formed by the lithography and the etching (FIG. 8I). After removing the resist film 29, a conductive metal layer 30 is deposited on the whole surface of the wafer. For patterning this metal layer 30, a pattern of a resist layer 31 is formed by the lithography (FIG. 8J). By the etching thereafter, the patterning is effected on the metal layer 30, whereby the wiring layers 22 and 23 are formed, and thus the wiring of the transistor is completed (FIG. 8K).

According to the manufacturing method of the embodiment described above, it is possible to effect the super-fine processing, in which a value of about 0.1 μm can be obtained in the width of the channel region 11 and the diameter of the impurity ion implantation layer 36 for the gate electrode in the monocrystal silicon layer 13. Therefore, even in such a case that the channel concentration is set at a value of $1 \times 10^{-3}$ for reducing the electrical resistance at the channel part and that the width of the depletion layer can be of about 0.1 μm at most, the width of the depletion layer can be increased to such an extent that the channel region 11 is completely depleted by applying the reversed bias voltage across the gate electrode and the drain electrode, and the drain current can be controlled by the reverse bias voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method of a junction gate field effect transistor comprising the steps of:
   implanting impurity of a first conductivity type into a monocrystal silicon layer formed to be used as an active region on an insulating layer;
   covering surfaces of the monocrystal silicon layer and said insulating layer with a silicon oxide film after said step of implanting the impurity of a first conductivity type;
   implanting impurity of a second conductivity type into a portion to be used as a gate electrode in the monocrystal silicon layer by a focused ion beam method;
   implanting metal ions into a portion to be used as a gate electrode of the silicon oxide film covering the monocrystal silicon layer by the focused ion beam method;
   forming a polycrystal silicon gate electrode doped with impurity and having an area larger than the portion to be used as the gate electrode of the silicon oxide film to cover a surface of said portion to be used as the gate electrode; and
   implanting impurity of the second conductivity type into the monocrystal silicon layer, using said polycrystal silicon gate electrode as a mask, to form a source region and a drain region.

2. A manufacturing method of a junction gate field effect transistor according to claim 1, wherein phosphorus ions are used as the impurities of the second conductivity type to be implanted by the focused ion beam method into the portion to be used as the gate electrode of the monocrystal silicon layer.

3. A manufacturing method of a junction gate field effect transistor according to claim 1, wherein metal selected from gallium, indium, lead, gold, or alloy of two or more kinds of them is used as an ion source for the metal ions to be implanted by the focused ion beam method into the portion for the gate electrode of the silicon oxide film covering the monocrystal layer.

4. A manufacturing method of a junction gate field effect transistor according to claim 2, wherein an injection energy of a focused ion beam for implanting the phosphorus ions is set in a range from 50 KeV to 150 KeV, a dose is set in a range from $10^{15}/cm^2$ to $10^7/cm^2$.

5. A manufacturing method of a junction gate field effect transistor according to claim 3, wherein an injection energy of a focused ion beam for implanting the metal ions is set in a range from 100 KeV to 1000 KeV, a dose is set in a range from $10^{16}/cm^2$ to $10^{19}/cm2$.

6. A manufacturing method of a junction gate field effect transistor according to claim 1, wherein the step for implanting the impurity of the first conductivity type into the monocrystal silicon layer includes implantation of boron ions at a dose of approximately $1 \times 10^{12}/cm^2$.

7. A manufacturing method of a junction gate field effect transistor according to claim 1, wherein the step for forming the monocrystal silicon layer is effected by a gas phase growth method in which epitaxial growth of silicon is effected on crystalline insulating material having a lattice constant nearly equal to that of the silicon.

8. A manufacturing method of a junction gate field effect transistor according to claim 1, wherein the step for forming the monocrystal silicon layer is effected by a solid phase growth method in which the silicon substrate is covered with silicon oxide except for a portion forming an opening, amorphous silicon is deposited thereon and an annealing is effected at an temperature of about 600° C. to perform a solid phase epitaxial growth.

9. A manufacturing method of a junction gate field effect transistor according to claim 1, wherein the step for forming the monocrystal silicon layer is effected by an insulating film burying method in which oxygen or nitrogen ions are implanted into a monocrystal silicon, leaving the monocrystal silicon on a surface thereof and forming a silicon oxide layer or a silicon nitride layer at the interior thereof.

10. A manufacturing method of a junction gate field effect transistor according to claim 1, wherein the step for forming the source and drain regions includes implantation of arsenic or phosphorus at a dose in a range form $10^{15}/cm^2$ to $10^{17}/cm^2$.

11. A manufacturing method of a junction gate field effect transistor according to claim 1, wherein the respective steps are controlled so that a channel region of the first conductivity type formed between said source and drain regions and said gate electrode in said monocrystal silicon layer may have an impurity concentration of about $1 \times 10^{17}/cm^3$ and a width of about 0.1 μm.

12. A manufacturing method of a junction gate field effect transistor comprising the steps of:
forming a monocrystal silicon layer on an insulating substrate;
effecting an element separation by forming a resist mask on an area forming an active area on a surface of said monocrystal silicon layer, and removing said monocrystal silicon layer, except for the active area, by etching;
implanting boron ions into said monocrystal silicon layer;
covering with silicon oxide film a surface of said insulating substrate and the surface of said monocrystal silicon layer on which said element separation and said implantation of the boron ions has been effected;
implanting phosphorous ions or arsenic ions into a portion to be used as a gate electrode in the monocrystal silicon layer by a focused ion beam method;
implanting metal ions from an ion source into a portion to be used as a gate electrode of the silicon oxide film by the focused ion beam method, said ion source including metal selected from gallium, indium, lead, gold, or alloy of two or more kinds of them;
forming a polycrystal silicon gate electrode doped with impurities and having an area larger than the portion to be used as the gate electrode of the silicon oxide film to cover a surface of said portion to be used as the gate electrode;
implanting phosphorus ions or arsenic ions into the monocrystal silicon layer, using said polycrystal silicon gate electrode as a mask, to form a source region and a drain region; and
effecting conductive wirings on the formed transistor.

13. A manufacturing method of a junction gate field effect transistor according to claim 12, wherein of the boron ions implanted into said monocrystal silicon layer in a dose of approximately $10^{12}/cm^2$, and an injection energy of a focused ion beam for implanting the phosphorus ions or arsenic ions into said gate electrode is set in a range from 50 KeV to 150 KeV, a dose is set in a range from $10^{15}/cm^2$ to $10^{17}/cm^2$.

14. A manufacturing method of a junction gate field effect transistor according to claim 12, wherein an injection energy of a focused ion beam for injecting the metal ions is set in a range from 100 KeV to 1000 KeV, a dose is set in a range from $10^{16}/cm^2$ to $10^{19}/cm^2$.

15. A manufacturing method of a junction gate field effect transistor according to claim 12, wherein the step for forming the monocrystal silicon layer on the insulating substrate is effected by a gas phase growth method in which epitaxial growth of silicon is effected on crystalline insulating material having a lattice constant nearly equal to that of the silicon.

16. A manufacturing method of a junction gate field effect transistor according to claim 12, wherein the step for forming the monocrystal silicon layer on the insulating substrate is effected by a solid phase growth method in which the silicon substrate is covered with silicon oxide except for a portion forming an opening, amorphous silicon is deposited thereon and an annealing is effected at a temperature of about 600° C. to perform a solid phase epitaxial growth.

17. A manufacturing method of a junction gate field effect transistor according to claim 12, wherein the step for forming the monocrystal silicon layer on the insulating substrate is effected by an insulating film burying method in which oxygen or nitrogen ions are implanted into a monocrystal silicon, leaving the monocrystal silicon on a surface thereof and forming a silicon oxide layer or a silicon nitride layer at the interior thereof.

18. A manufacturing method of a junction gate field effect transistor according to claim 1, wherein the step for forming the source and drain regions includes implantation of arsenic ions or phosphorus ions at a dose in a range from $10^{15}/cm^2$ to $10^{17}/cm^2$.

* * * * *